(12) United States Patent
Kang et al.

(10) Patent No.: US 7,880,095 B2
(45) Date of Patent: Feb. 1, 2011

(54) GASKET AND DISPLAY APPARATUS HAVING THE SAME

(75) Inventors: Ha-Yun Kang, Chungcheongnam-do (KR); Gun-Ho Kim, Gyeonggi-do (KR); Jae-Kook Kim, Chungcheongnam-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 686 days.

(21) Appl. No.: 11/859,635

(22) Filed: Sep. 21, 2007

(65) Prior Publication Data
US 2008/0078574 A1   Apr. 3, 2008

(30) Foreign Application Priority Data
Oct. 2, 2006 (KR) .................. 10-2006-0097332

(51) Int. Cl.
*H05K 9/00* (2006.01)
(52) U.S. Cl. .................. 174/356; 174/369; 174/377; 313/313
(58) Field of Classification Search .......... 174/366, 174/368, 369, 377, 356; 361/816, 818; 313/313
See application file for complete search history.

(56) References Cited

U.S. PATENT DOCUMENTS

| | | | |
|---|---|---|---|
| 6,560,124 B1 * | 5/2003 | Irie et al. ............. 361/816 |
| 7,362,043 B2 * | 4/2008 | Cha ..................... 313/112 |
| 7,388,331 B2 * | 6/2008 | Park .................... 313/582 |
| 7,425,133 B2 * | 9/2008 | Park ..................... 439/61 |
| 2002/0108767 A1 | 8/2002 | Kim |
| 2003/0173100 A1 * | 9/2003 | Flaherty et al. ....... 174/359 |
| 2005/0017620 A1 * | 1/2005 | Kim et al. ............ 313/112 |
| 2006/0049490 A1 * | 3/2006 | Byun .................... 257/659 |
| 2006/0103081 A1 * | 5/2006 | Dietrich et al. ........ 277/653 |

FOREIGN PATENT DOCUMENTS

| | | |
|---|---|---|
| CN | 1304278 A | 7/2001 |
| CN | 1744808 A | 3/2006 |
| CN | 1761387 A | 4/2006 |

* cited by examiner

*Primary Examiner*—Hung V Ngo
(74) *Attorney, Agent, or Firm*—Innovation Counsel LLP (57) ABSTRACT

A gasket is interposed between a circuit board that generates electromagnetic waves and a conductive member, and includes an elastic member separating the circuit board from the conductive member. The gasket is electrically connected with the circuit board by a conductive layer to receive the electromagnetic waves from the circuit board. The conductive layer is covered with an insulating layer except for a contact area where the conductive layer is coupled with the circuit board. The insulating layer blocks the electromagnetic waves received from the circuit board. The electromagnetic wave noise of a display apparatus is reduced even if a contact failure occurs between the gasket and a top chassis.

15 Claims, 8 Drawing Sheets

GASKET AND DISPLAY APPARATUS HAVING THE SAME

CROSS-REFERENCE TO RELATED APPLICATION

This application claims the benefit of priority to Korean Patent Application No. 2006-97332 filed on Oct. 2, 2006, the contents of which are herein incorporated by reference in its entirety.

BACKGROUND OF THE INVENTION

1. Field of the Invention

The disclosure relates to a gasket and a display apparatus having the gasket. More particularly, one embodiment relates to a gasket capable of blocking electromagnetic waves and a display apparatus having the gasket.

2. Description of the Related Art

In general, a liquid crystal display (LCD) includes a liquid crystal display panel displaying an image, a printed circuit board controlling the liquid crystal display panel, a bottom chassis on which the liquid crystal display panel is settled, and a top chassis coupling the liquid crystal display panel with the bottom chassis. The bottom chassis and the top chassis each include a plurality of sidewalls, and are coupled with each other such that the sidewalls face each other.

When the printed circuit board is placed between the sidewalls of the bottom chassis and the top chassis, a gasket is provided between the printed circuit board and the top chassis. Electromagnetic waves generated from the printed circuit board to the top chassis are reduced because the electromagnetic waves are transmitted to the top chassis through the gasket.

However, when the top chassis is coupled with the bottom chassis, a contact failure may occur between the sidewalls of the top chassis and the gasket. In this case, the electromagnetic waves transmitted to the gasket from the printed circuit board are not transmitted to the top chassis, but emitted to the exterior of the chassis through the gasket. Accordingly, when an assembly failure of a display apparatus occurs, electromagnetic wave noise of the display apparatus increases, thereby degrading reliability of a product.

SUMMARY OF THE INVENTION

In one embodiment, a gasket capable of blocking electromagnetic waves is described.

Another embodiment provides a display apparatus having the gasket.

In one aspect, the gasket includes an elastic member, a conductive layer, and an insulating layer. The elastic member is interposed between a circuit board that generates electromagnetic waves and a conductive member to separate the circuit board from the conductive member. The conductive layer is electrically connected with the circuit board to receive the electromagnetic waves from the circuit board. Except for an area where the conductive layer couples with the circuit board, the insulating layer is provided on a predetermined area of the conductive layer to block the electromagnetic waves received from the circuit board.

In another aspect, a display apparatus includes a receiving member, a display panel, a printed circuit board, a covering member, and a gasket. The display panel is settled on the receiving member to display an image in response to a driving signal. The printed circuit board is electrically connected with the display panel to provide the driving signal to the display panel, and is provided adjacent to one side of the receiving member. The covering member is coupled with the receiving member while facing the receiving member to cover an edge part of the display panel and the printed circuit board. The gasket is interposed between the printed circuit board and the covering member to block electromagnetic waves generated from the printed circuit board.

The gasket includes an elastic member, a conductive layer and an insulating layer. The elastic member is interposed between the printed circuit board and the covering member to separate the printed circuit board from the covering member. The conductive layer is electrically connected with the printed circuit board to receive the electromagnetic waves from the printed circuit board. Except for an area where the conductive layer couples with the circuit board, the insulating layer is provided on a predetermined area of the conductive layer to block the electromagnetic waves received from the printed circuit board.

According to the above, when a contact failure occurs between the gasket and the top chassis the insulating layer provided on the conductive layer blocks the electromagnetic waves received from the printed circuit board to prevent the electromagnetic waves from being emitted to the exterior. Accordingly, the electromagnetic wave noise of the display apparatus may be reduced.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Hereinafter, the present invention will be explained in detail with reference to the accompanying drawings. In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Figure 1:
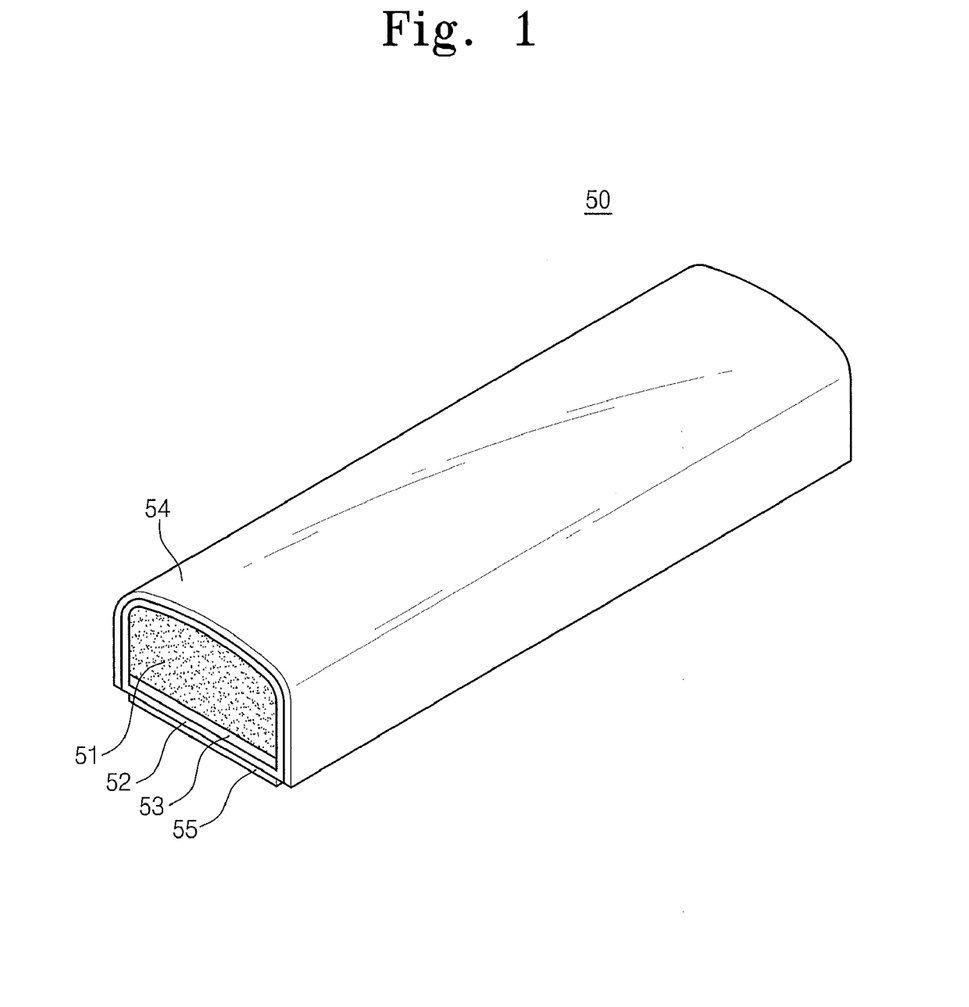
FIG. 1 is a perspective view showing a gasket according to an exemplary embodiment.
Figure 2:
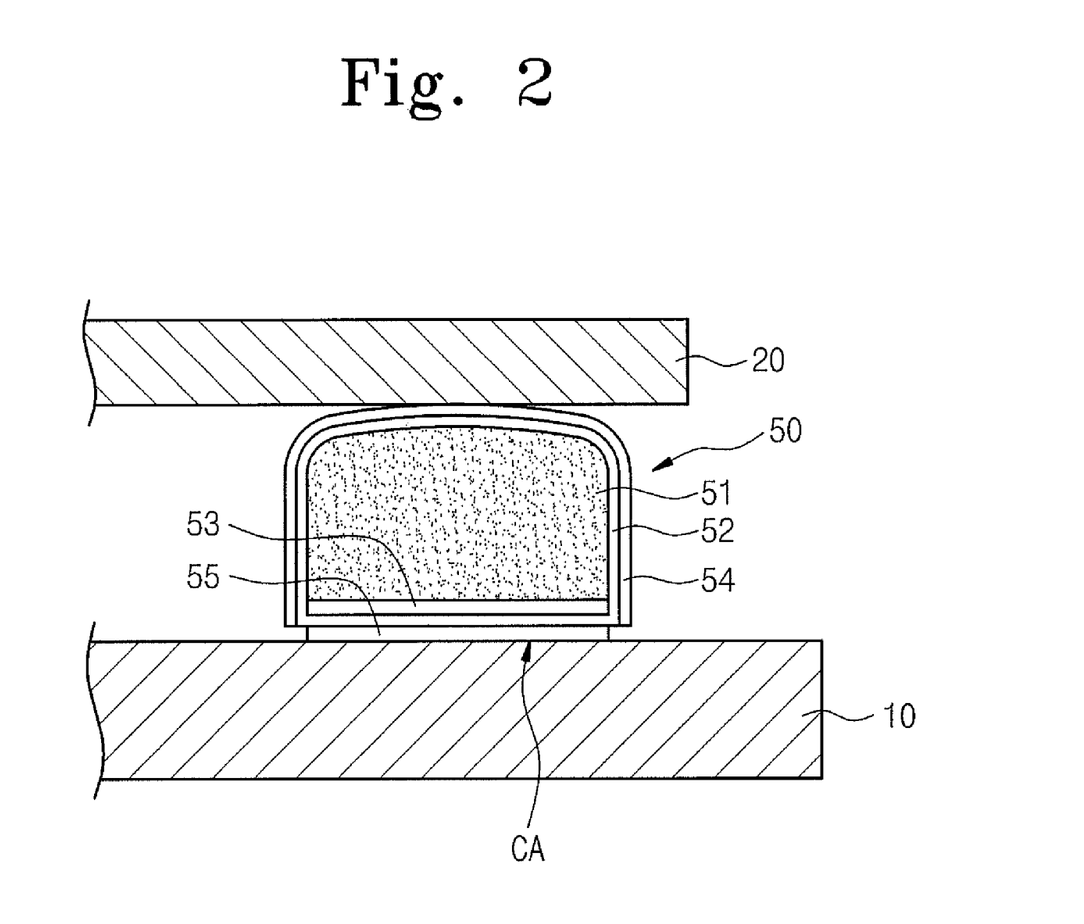
FIG. 2 is a sectional view showing a coupling state of the gasket shown in FIG. 1 relative to a circuit board and a conductive member.

FIG. 1 is a perspective view showing a gasket according to an exemplary embodiment, and FIG. 2 is a sectional view showing a coupling state of the gasket shown in FIG. 1 relative to a circuit board and a conductive member.

Referring to FIGS. 1 and 2, a gasket 50 is interposed between a circuit board 10 and a conductive member 20 to receive and block electromagnetic waves generated from the circuit board 10. The gasket 50 includes an elastic member 51, a conductive layer 52, a supporting film 53, an insulating layer 54, and an adhesive tape 55.

The elastic member 51 is interposed between the circuit board 10 and the conductive member 20, and has a predetermined thickness such that the circuit board 10 and the conductive member 20 are spaced apart from each other by a predetermined distance. The elastic member 51 includes an elastic polymer, such as elastic rubber or polyurethane sponge. The elastic polymer has a material memory, that is, the elastic polymer deforms when an external force is applied and returns to its original position when the external force is removed. Thus, when the circuit board 10 is coupled with the conductive member 20, the gasket 50 may be easily interposed between the circuit board 10 and the conductive member 20 due to the elastic member 51.

The conductive layer 52 may entirely surround the elastic member 51, and is electrically connected with the circuit board 10 to receive the electromagnetic waves from the circuit board 10. The conductive layer 52 includes conductive fiber and a hot melt film having a flame proofing agent. For instance, the conductive fiber is formed by plating polyester with metals such as copper or nickel. Therefore, the electromagnetic waves generated from the circuit board 10 are able to conduct or flow through the conductive fiber. In the present exemplary embodiment, the conductive fiber has a surface resistance of about 0.03 Ω/sq. Meanwhile, the hot melt film is an adhesive film that serves to bond the conductive fiber with the elastic member 51.

The supporting film 53 is provided between the elastic member 51 and the conductive layer 52 in a region corresponding to a contact area CA where the gasket 50 is coupled with the circuit board 10. The supporting film 53 supports the elastic member 51 in the contact area CA. In particular, the supporting film 53 has a size corresponding to the contact area CA, and includes a plastic material. For example, the supporting film 53 may include polyethylene terephthalate (PET). The supporting film 53 may also include a metallic material having a conductive property.

In addition, the supporting film 53 presses the conductive layer 52 against the circuit board 10 to prevent the conductive layer 52 from separating from the circuit board 10 in the contact area CA due to an external force. Accordingly, the conductive layer 52 and the circuit board 10 may be stably connected with each other in the contact area CA by the supporting film 53.

Although not shown in the figures, the supporting film 53 may be fixed to the elastic member 51 and the conductive layer 52 by an adhesive to prevent the supporting film 53 from being separated from the elastic member 51 and the conductive layer 52.

In this manner, since the gasket 50 is stably coupled with the circuit board 10 by the supporting film 53, the gasket 50 may be prevented from being separated from the circuit board 10 by an external impact. In particular, even if the conductive member 20 is moved the gasket 50 may be prevented from being lifted up.

The insulating layer 54 is provided on the conductive layer 52 to block the electromagnetic waves received from the circuit board 10. The insulating layer 54 covers the conductive layer 52 except for a predetermined portion of the conductive layer 52 corresponding to the contact area CA. Therefore, the insulating layer 54 may block the electromagnetic waves transmitted to the conductive layer 52 from the circuit board 10.

The insulating layer 54 includes a polyester film and a hot melt film having a resistance. In an exemplary embodiment, the insulating layer 54 has a thickness of about 0.07 mm or less, so the entire thickness of the gasket 50 is increased very little. Moreover, the insulating layer 54 has a black color such that the gasket 50 may efficiently block the electromagnetic waves.

When using a conventional gasket without an insulating layer 54, in the event of an assembly failure, the circuit board 10 and the conductive member 20 separate from each other by a distance greater than the thickness of the gasket. Since the conventional gasket is bonded to the circuit board 10, the conventional gasket will then receive the electromagnetic waves from the circuit board 10. However, during assembly failure the conventional gasket is separated from the conductive member 20 by a distance greater than the thickness of the gasket. Thus, the electromagnetic waves are not transmitted to the conductive member 20, and are instead emitted through the conventional gasket.

According to one exemplary embodiment, if the circuit board 10 and the conductive member 20 are spaced apart from each other by a large distance the gasket 50, the insulating layer 54 blocks the electromagnetic waves received from the circuit board 10. Thus, the gasket 50 can still prevent the electromagnetic waves from being emitted to the exterior. As a result, the gasket 50 may reduce the electromagnetic wave noise in a product provided with the circuit board 10 and the conductive member 20.

The adhesive tape 55 is interposed between the conductive layer 52 and the circuit board 10 in the contact area CA such that the gasket 50 is bonded to the circuit board 10. The adhesive tape 55 is a double-sided tape in which a first side is bonded to the conductive layer 52 and a second side is bonded to the circuit board 10, such that the gasket 50 is attached to the circuit board 10.

For example, the adhesive tape 55 may include a conductive mesh and a conductive adhesive. The conductive mesh is formed by plating a mesh-type fiber with nickel powder, and the adhesive is coated onto the conductive mesh. The adhesive tape 55 has a predetermined adhesive intensity such that the gasket 50 may be prevented from being separated from the circuit board 10. In the present exemplary embodiment, the adhesive tape 55 has an adhesive intensity of 800 gf/25 mm or more.

Figure 3:
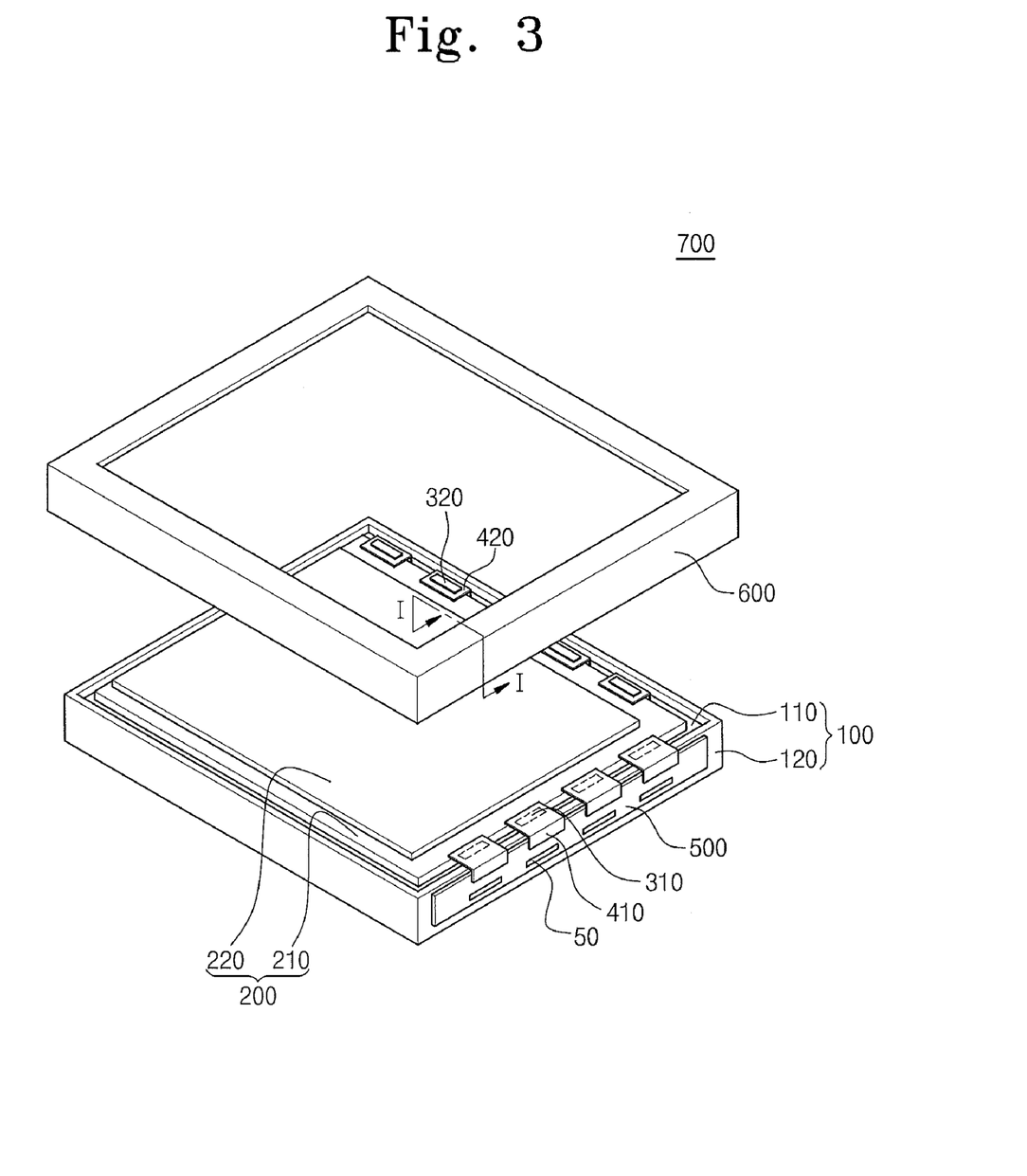
FIG. 3 is an exploded perspective view of a liquid crystal display having the gasket shown in FIG. 1.
Figure 4:
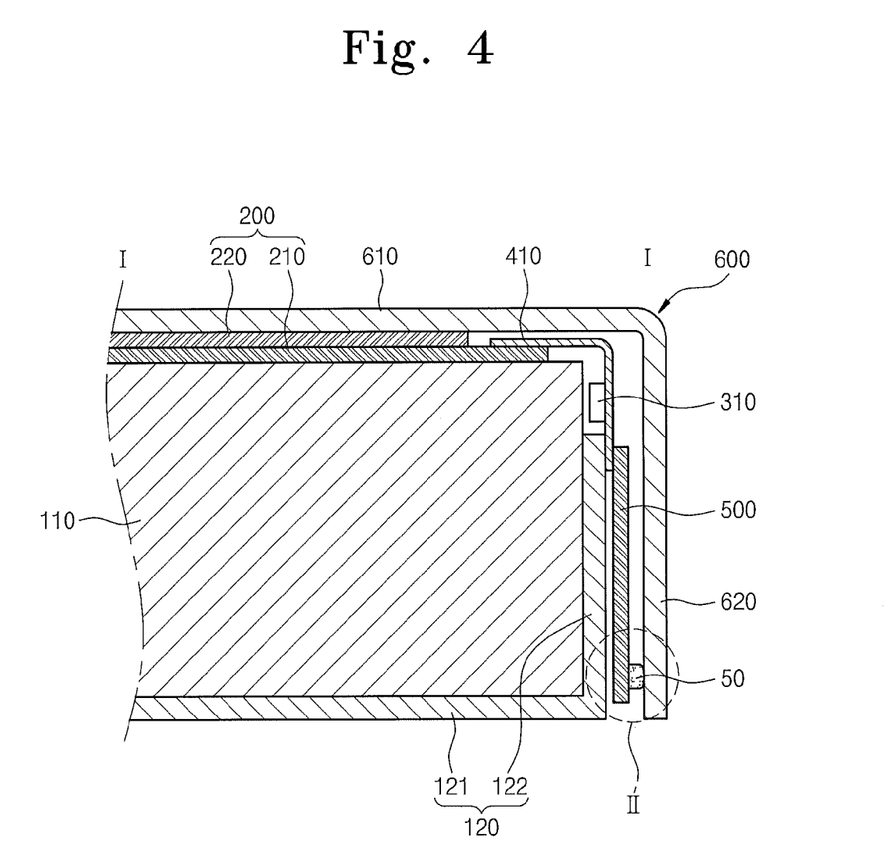
FIG. 4 is a sectional view of a liquid crystal display taken along line I-I' shown in FIG. 3.

FIG. 3 is an exploded perspective view of a liquid crystal display having the gasket shown in FIG. 1, and FIG. 4 is a sectional view of a liquid crystal display taken along line I-I' shown in FIG. 3.

Referring to FIGS. 3 and 4, a liquid crystal display 700 includes a receiving member 100, a liquid crystal display panel 200, a data driving chip 310, a gate driving chip 320 and a top chassis 600.

The receiving member 100 includes a mold frame 110 and a bottom chassis 120. For instance, the mold frame 110 has a frame shape, and the bottom chassis 120 includes a bottom surface 121 and a first sidewall 122 extending from the bottom surface 121 such that the bottom chassis 120 is coupled with the mold frame 110. A backlight unit (not shown) generating light is received in a receiving space of the bottom chassis 120.

The liquid crystal display panel 200 includes an array substrate 210, a color filter substrate 220 coupling with the array substrate 210 while facing the array substrate 210, and a liquid crystal layer (not shown) interposed between the array substrate 210 and the color filter substrate 220.

Although not shown in figures, the array substrate 210 is provided with a plurality of data lines and gate lines, which cross each other while being insulated from each other. A plurality of pixel areas are defined on the array substrate 210 in a matrix formed by the data lines and the gate lines, and a plurality of pixels are arranged in the pixel areas, respectively. Each of the pixels include a thin film transistor and a corresponding pixel electrode. The data lines apply a pixel voltage to the corresponding thin film transistor, and the gate lines apply a gate voltage to the corresponding thin film transistor. Each pixel applies the pixel voltage to the corresponding pixel electrode in response to the gate voltage.

The color filter substrate 220 includes a color filter layer and a common electrode facing the pixel electrode. A common voltage, which is a reference voltage, is applied to the common electrode. The light transmittance of the liquid crystal layer is controlled according to a potential difference between the pixel voltage and the common voltage to display the image.

The data driving chip 310 is electrically connected with the data lines, and outputs the pixel voltage to the data lines. The gate driving chip 320 is electrically connected with the gate lines, and sequentially outputs the gate voltage to the gate lines.

The liquid crystal display 700 includes a printed circuit board 500 controlling operations of the data driving chip 310 and the gate driving chip 320, a first tape carrier package (hereinafter, referred to as 'TCP') 410 on which the data driving chip 310 is mounted, and a second TCP 420 on which the gate driving chip 320 is mounted. The first TCP 410 electrically connects the printed circuit board 500 with the liquid crystal display panel 200.

The data driving chip 310 receives through the first TCP 410 a data control signal and an image data signal from the printed circuit board 500, converts the image data signal into the pixel voltage, and outputs the pixel voltage. The pixel voltage is applied to the data lines of the liquid crystal display panel 200 through the first TCP 410. The gate driving chip 320 mounted on the second TCP 420 receives a gate control signal from the printed circuit board 500 through the first TCP 410 and a signal transmission line (not shown) provided in the liquid crystal display panel 200, and outputs the gate voltage to the gate lines of the liquid crystal display panel 200 through the second TCP 420.

The second TCP 420 is settled on a top surface of the mold frame 110. The first TCP 410 is bent such that the printed circuit board 500 is settled on one side of the bottom chassis 120. A plurality of gaskets 50 are provided on a top surface of the printed circuit board 500.

The top chassis 600 may include a clamp-like shape defined by an upper surface 610 and a second sidewall 620 extending from the upper surface 610. While facing the bottom chassis, the top chassis 600 is coupled with the bottom chassis 120 to fix or connect the liquid crystal display panel 200 to the mold frame 110.

As shown in FIG. 4, when the liquid crystal display 700 is assembled, the gasket 50 is interposed between the printed circuit board 500 of the bottom chassis 120 and the second sidewall 620 of the top chassis 600.

Figure 5:
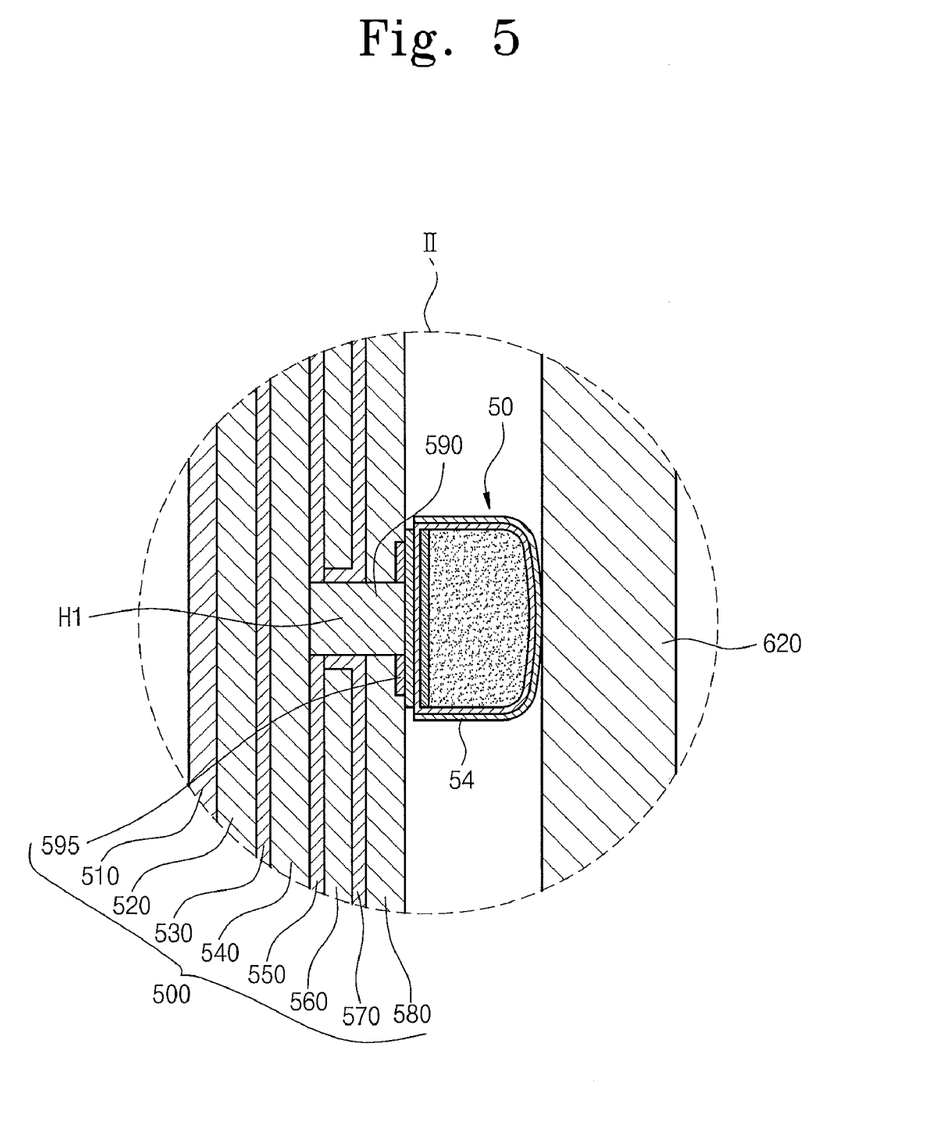
FIG. 5 is an enlarged sectional view of portion II shown in FIG. 4.

FIG. 5 is an enlarged sectional view of portion 11 shown in FIG. 4.

Referring to FIG. 5, the printed circuit board 500 has a multi-layered structure including a first interconnection 520, a ground 540, a power source 560, and a second interconnection 580. The first interconnection 520 is formed on a base layer 510 having epoxy resin. The first interconnection 520 and the second interconnection 580 include a plurality of interconnection patterns. The ground 540 includes a single metal plate, and the power source 560 includes a plurality of metal plates spaced apart from each other.

The printed circuit board 500 further includes a first insulating layer 530, a second insulating layer 550, and a third insulating layer 570. The first insulating layer 530 is interposed between the first interconnection 520 and the ground 540 such that the first interconnection 520 is insulated from the ground 540. The second insulating layer 550 is interposed between the ground 540 and the power source 560 such that the ground 540 is insulated from the power source 560. The third insulating layer 570 is formed on the power source 560 to cover the metal plates, such that the metal plates are insulated from each other, and the power source 560 and the second interconnection 580 are insulated from each other.

Meanwhile, to prevent the emission of electromagnetic waves generated from the printed circuit board 500 to the exterior, the gasket 50 is electrically connected to the ground 540. A hole H1 is formed through the second interconnection 580, the third insulating layer 570, and the second insulating layer 550 to expose the ground 540. The hole H1 is provided with a metal layer 590 such that the gasket 50 and the ground 540 are electrically connected to each other. Accordingly, the gasket 50 is electrically connected to the ground 540 through the metal layer 590 to receive the electromagnetic waves introduced into the ground 540.

The printed circuit board 500 further includes a conductive pattern 595 on the second interconnection 580 to increase the contact area between the printed circuit board 500 and the gasket 50. The conductive pattern 595 includes metallic materials such as copper and gold, such that the ground 540 of the printed circuit board 500 is electrically connected to the gasket 50.

When the top chassis 600 is coupled with the bottom chassis 120, if a contact failure occurs between the top chassis 600 and the gasket 50, the gasket 50 blocks the electromagnetic waves generated from the printed circuit board 500 to prevent the electromagnetic waves from being emitted to the exterior.

Due to assembly failure, when using the conventional gasket without an insulating layer 54 the printed circuit board 500 and the top chassis 600 may be spaced apart from each other by a predetermined distance greater than the thickness of the conventional gasket. The conventional gasket is spaced apart from the top chassis 600 by a predetermined distance so that the electromagnetic waves received from the printed circuit board 500 are not transmitted to the top chassis 600, but emitted through the conventional gasket to the exterior of the chassis.

According to one exemplary embodiment, if the printed circuit board 500 and the top chassis 600 are spaced apart from each other by a great distance, the gasket 50 blocks the electromagnetic waves received from the printed circuit board 500 by using the insulating layer 54 to prevent the electromagnetic waves from being emitted to the exterior. As a result, the gasket 50 allows electromagnetic wave noise of the liquid crystal display 700 to be reduced even though the gasket 50 no longer contacts the top chassis 600.

Figure 6A:
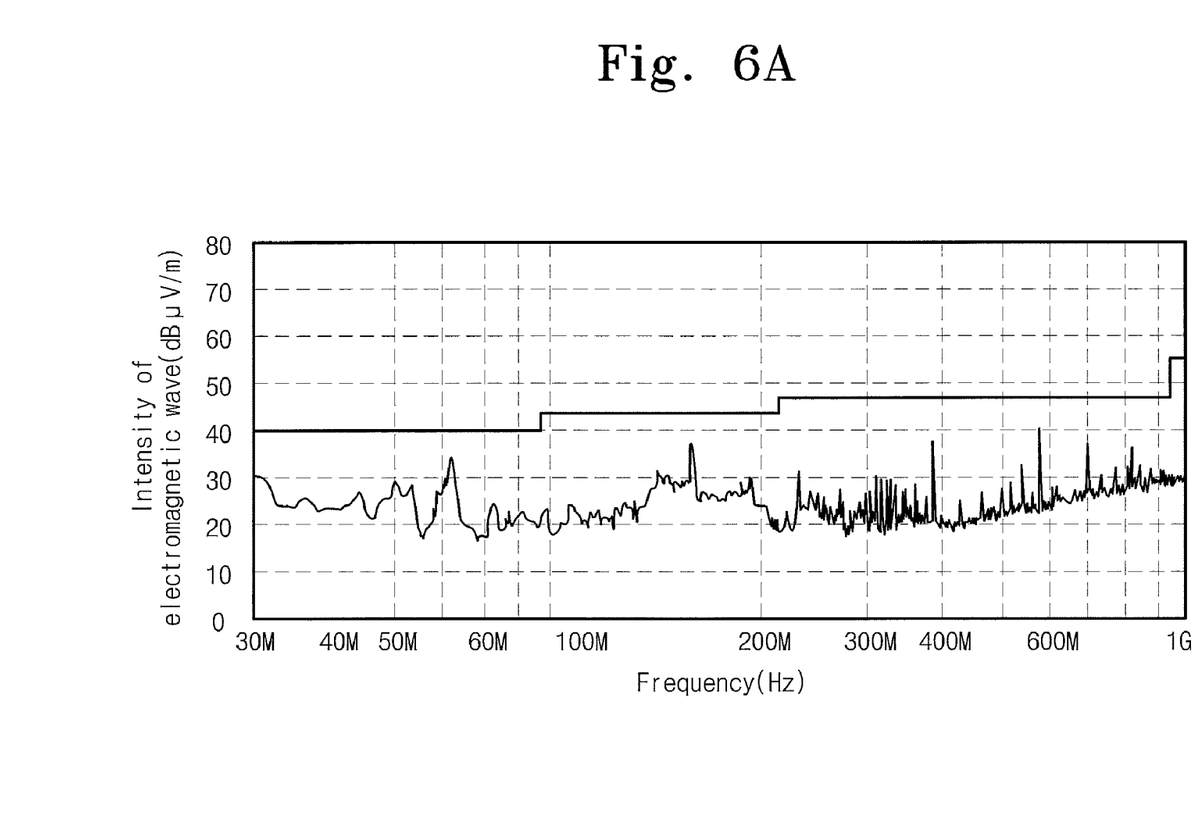
FIG. 6A is a graph showing electromagnetic wave noise according to a comparative example 1.
Figure 6B:
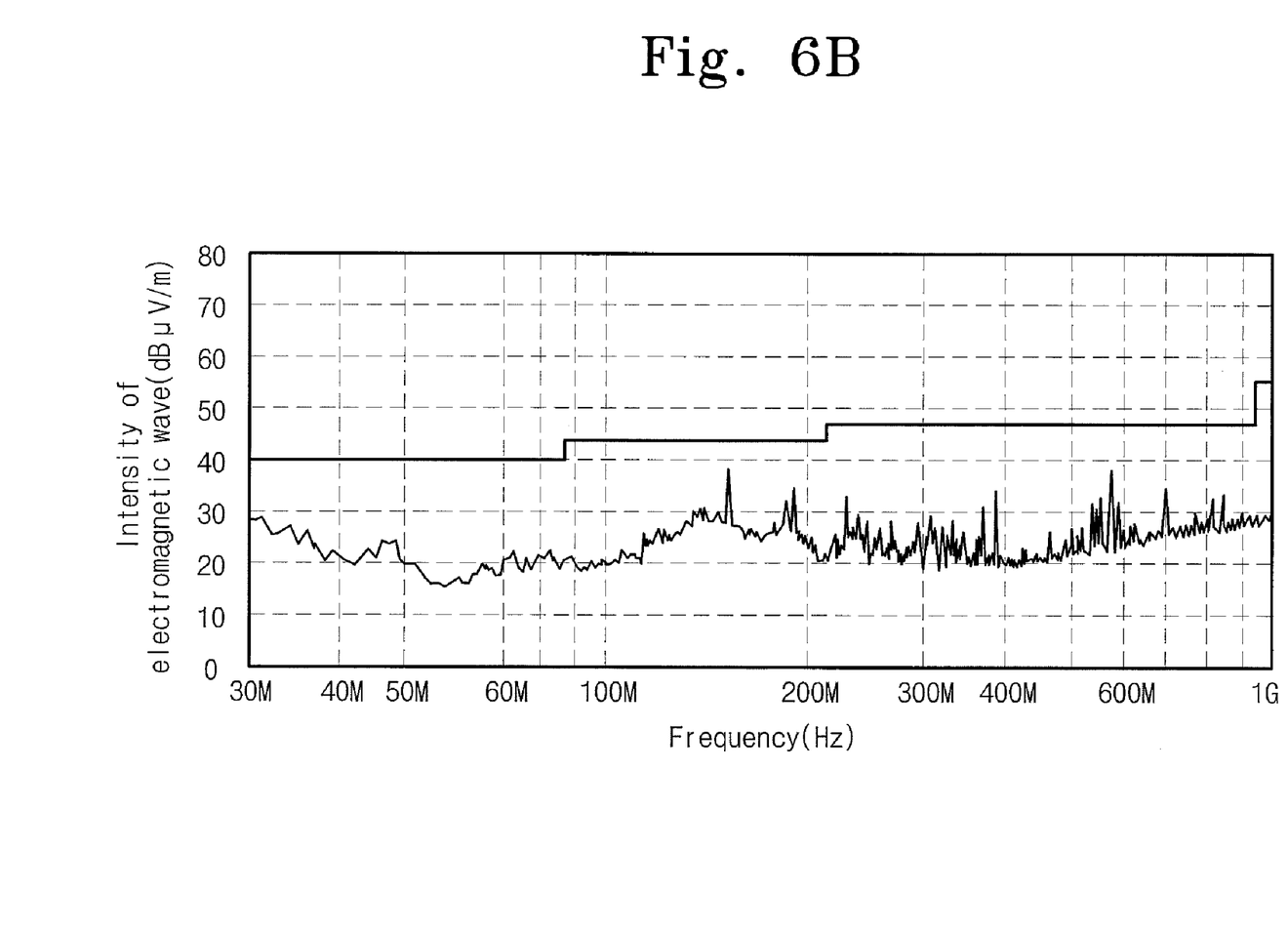
FIG. 6B is a graph showing electromagnetic wave noise according to a comparative example 2.
Figure 6C:
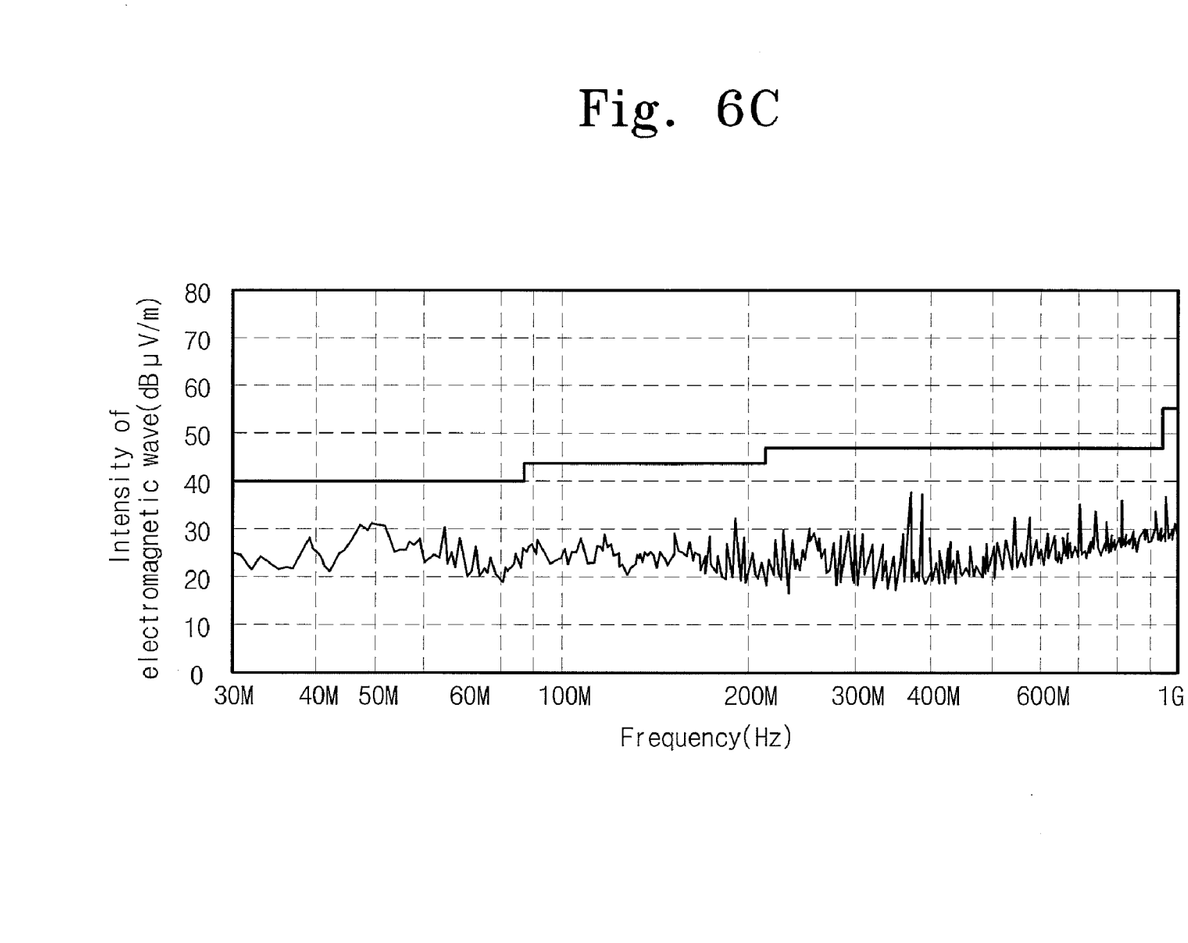
FIG. 6C is a graph showing electromagnetic wave noise according to an experimental example.

FIG. 6A is a graphic view showing electromagnetic wave noise according to a comparative example 1, FIG. 6B is a graphic view showing electromagnetic wave noise according to a comparative example 2, and FIG. 6C is a graphic view showing electromagnetic wave noise according to an experimental example.

The comparative example 1 shows the electromagnetic wave noise measured in a conventional liquid crystal display having no gasket, the comparative example 2 shows the electromagnetic wave noise measured in a conventional liquid crystal display in which a contact failure occurs between a conventional gasket and a top chassis, and the experimental example shows the electromagnetic wave noise measured in a liquid crystal display having a gasket according to the present invention.

In FIGS. 6A through 6C, an x-axis represents a frequency (Hz) and an y-axis represents an intensity of electromagnetic wave (dBµV/m).

Referring to FIGS. 6A through 6C, the intensity of electromagnetic wave in the low-frequency band is measured higher in the comparative example 1 than the comparative example 2 and the experimental example.

Meanwhile, in a driving frequency band (80 Hz to 160 Hz) of the liquid crystal display, the comparative examples 1 and 2 represent higher intensity of electromagnetic wave than that of the experimental example. Particularly, the intensity of electromagnetic wave in the experimental example is about 10 (dBµV/m), which is lower than the intensity of electromagnetic wave of the comparative example 2.

As a result, the electromagnetic wave noise of the liquid crystal display having the gasket capable of blocking the electromagnetic waves may be reduced.

According to an exemplary embodiment of a the liquid crystal display having a gasket, the gasket includes a conductive layer receiving the electromagnetic waves from the printed circuit board and an insulating layer covering the conductive layer. When a contact failure occurs between the gasket and the top chassis, electromagnetic waves not transmitted to the top chassis are blocked from being emitted to the exterior by the insulating layer. Accordingly, the electromagnetic wave noise of the liquid crystal display may be reduced.

Although the exemplary embodiments of the present invention have been described, it is understood that the present invention should not be limited to these exemplary embodiments but various changes and modifications can be made by one of ordinary skilled in the art within the spirit and scope of the present invention as hereinafter claimed.

What is claimed is:

1. A gasket comprising:
    an elastic member interposed between a circuit board that generates electromagnetic waves and a conductive member to separate the circuit board from the conductive member;
    a conductive layer surrounding the elastic member;
    a supporting film interposed between the elastic member and the conductive layer to support the elastic member;
    a conductive adhesive tape interposed between the conductive layer and the circuit board to which the conductive layer is electrically connected to receive the electromagnetic waves through the conductive adhesive tape; and
    an insulating layer to block the electromagnetic waves from the circuit board, the insulating layer covering a surface of the conductive layer except for a contact area of the conductive layer where the conductive adhesive tape is attached.

2. The gasket of claim 1, wherein the insulating layer comprises a polyester film and a hot melt film having a flame proofing agent.

3. The gasket of claim 1, wherein the insulating layer has a thickness of about 0.07 mm or less.

4. The gasket of claim 1, wherein the insulating layer has a black color.

5. The gasket of claim 1, wherein the conductive layer comprises conductive fiber comprising polyester and a copper and nickel alloy, and a hot melt film having a flame proofing agent.

6. The gasket of claim 1, wherein the elastic member comprises polyurethane sponge having a predetermined thickness.

7. The gasket of claim 1, wherein the supporting film comprises polyethylene terephthalate.

8. The gasket of claim 1, wherein the adhesive tape comprises a mesh-type conductive fiber and a conductive adhesive.

9. A display apparatus comprising:
    a receiving member;
    a display panel settled on the receiving member to display an image in response to a driving signal;
    a printed circuit board electrically connected with the display panel to provide the driving signal to the display panel, the circuit board provided adjacent to one side of the receiving member;
    a covering member coupled with the receiving member while facing the receiving member to cover an edge portion of the display panel and the printed circuit board; and
    a gasket interposed between the printed circuit board and the covering member to block electromagnetic waves generated from the printed circuit board,
    wherein the gasket comprises:
    an elastic member interposed between the printed circuit board and the covering member to separate the printed circuit board from the covering member;
    a conductive layer electrically connected with the printed circuit board to receive the electromagnetic waves from the printed circuit board; and
    an insulating layer to block the electromagnetic waves received from the printed circuit board, the insulating layer covering a surface of the conductive layer except for a contact area where the conductive layer is coupled with the circuit board.

10. The display apparatus of claim 9, wherein the insulating layer comprises a polyester film and a hot melt film having a flame proofing agent.

11. The display apparatus of claim 10, wherein the insulating layer has a black color.

12. The display apparatus of claim 9, wherein the gasket further comprises a supporting film interposed between the elastic member and the conductive layer in an area corresponding to the area of the conductive layer making contact with the printed circuit board to support the elastic member.

13. The display apparatus of claim 9, wherein the gasket further comprises an adhesive tape interposed between the conductive layer and the printed circuit board in an area corresponding to the area of the conductive layer making contact with the printed circuit board such that the adhesive tape is bonded to the printed circuit board.

14. The display apparatus of claim 9, wherein the covering member is a top chassis comprising conductive materials.

15. The display apparatus of claim 9, wherein the printed circuit board comprises:
    a base layer;
    at least one interconnection layer arranged on the base layer;
    a ground;
    an insulating layer between the interconnection layer and the ground;
    a metal layer to connect the ground to the gasket; and
    a conductive pattern to increase a contact area between the printed circuit board and the gasket.

* * * * *